United States Patent
Meng et al.

(10) Patent No.: US 9,589,616 B2
(45) Date of Patent: Mar. 7, 2017

(54) ENERGY EFFICIENT THREE-TERMINAL VOLTAGE CONTROLLED MEMORY CELL

(71) Applicant: GLOBALFOUNDRIES Singapore Pte. Ltd., Singapore (SG)

(72) Inventors: Hao Meng, Singapore (SG); Yong Wee Francis Poh, Singapore (SG); Tze Ho Simon Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/927,500

(22) Filed: Oct. 30, 2015

(65) Prior Publication Data

US 2016/0125925 A1 May 5, 2016

Related U.S. Application Data

(60) Provisional application No. 62/074,085, filed on Nov. 2, 2014.

(51) Int. Cl.
*G11C 11/00* (2006.01)
*G11C 11/16* (2006.01)
(Continued)

(52) U.S. Cl.
CPC .......... *G11C 11/161* (2013.01); *G11C 11/14* (2013.01); *G11C 11/15* (2013.01); *G11C 11/16* (2013.01);
(Continued)

(58) Field of Classification Search
CPC .......... G11C 11/16; G11C 11/15; G11C 11/14
USPC ........................................... 365/157
See application file for complete search history.

(56) References Cited

U.S. PATENT DOCUMENTS 7,166,881 B2 * 1/2007 Lin ................. G11C 11/15
257/295
7,378,699 B2 * 5/2008 Hayakawa ........ B82Y 10/00
257/2

(Continued)

OTHER PUBLICATIONS

S. Kanai et al., "Electric field-induced magnetization reversal in a perpendicular-anisotropy CoFeB—MgO magnetic tunnel junction", Applied Physics Letters 101, 2012, American Institute of Physics.

(Continued)

Primary Examiner — Pho M Luu
(74) Attorney, Agent, or Firm — Horizon IP Pte. Ltd.

(57) ABSTRACT

Memory cell, method for operating the memory cell and method for fabricating the memory cell are disclosed. The memory cell includes at least three terminals, a first magnetic tunnel junction (MTJ) structure and a second MTJ structure. The first MTJ is coupled between a first terminal (FT) and a third terminal. A portion of the first MTJ is configured to include a first barrier layer disposed between a first fixed layer and a free layer (FL). A magnetization direction of the FL is used to store data, the magnetization direction being controlled by an electric field. The second MTJ is coupled between the FT and a second terminal, where a portion of the second MTJ is configured to include a second barrier layer disposed between a second fixed layer and the FL, where a tunnel magnetoresistance of the second barrier layer is used to read the data.

18 Claims, 14 Drawing Sheets

(51) Int. Cl.
  H01L 43/02    (2006.01)
  H01L 43/08    (2006.01)
  H01L 43/12    (2006.01)
  G11C 11/15    (2006.01)
  G11C 11/14    (2006.01)

(52) U.S. Cl.
  CPC ...... *G11C 11/1659* (2013.01); *G11C 11/1673* (2013.01); *G11C 11/1675* (2013.01); *H01L 43/02* (2013.01); *H01L 43/08* (2013.01); *H01L 43/12* (2013.01)

(56) References Cited

U.S. PATENT DOCUMENTS

| | | | | |
|---|---|---|---|---|
| 9,105,831 | B2* | 8/2015 | Fukami | H01L 43/08 |
| 2015/0200003 | A1* | 7/2015 | Buhrman | G11C 11/18 |
| | | | | 365/158 |

OTHER PUBLICATIONS

Yiming Huai, "Spin-Transfer Torque MRAM (STT-MRAM): Challenges and Prospects", AAPPS Bulletin, Dec. 2008, pp. 33-40, vol. 18, No. 6.

Yoichi Shiota et al., "Induction of coherent magnetization switching in a few atomic layers of FeCo using voltage pulses", Letter, Nature Materials 11, 2012, Macmillan Publishers Limited, part of Springer Nature.

Eric Pop, Energy Dissipation and Transport in Nanoscale Devices, Nano Research, 2010, pp. 147-169, vol. 3, Tsinghua University Press.

Koji Ando et al., "Spin-transfer torque magnetoresistive randomaccess memory technologies for normally off computing", Journal of Applied Physics, Apr. 2014, vol. 115, AIP Publishing LLC.

L. Berger, "Emission of spin waves by a magnetic multilayer traversed by a current", Physical Review B, 1996, pp. 9353-9358, vol. 54, No. 13, The American Physical Society.

Niladri Narayan Mojumder et al., "A Three-Terminal Dual-Pillar STT-MRAM for High-Performance Robust Memory Applications", IEEE Transactions on Electron Devices, May 2011, pp. 1508-1516, vol. 58, No. 5, IEEE.

Patrick M. Braganca et al., "A Three-Terminal Approach to Developing Spin-Torque Written Magnetic Random Access Memory Cells", IEEE Transactions on Nanotechnology, Mar. 2009, pp. 190-195, vol. 8, No. 2, IEEE.

Wei-Gang Wang et al., "Electric-field-assisted switching in magnetic tunnel junctions", Article, Nature Materials 11, 2012, pp. 64-68, Macmillan Publishers Limited, part of Springer Nature.

* cited by examiner

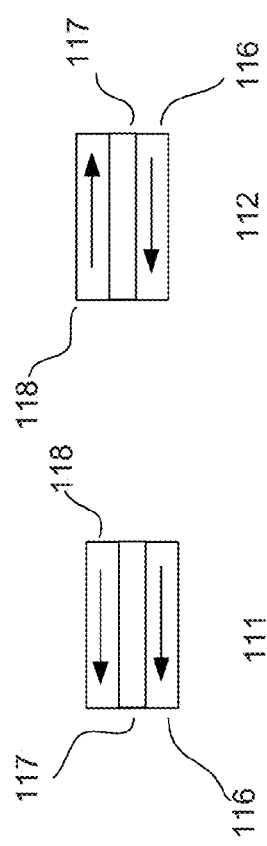
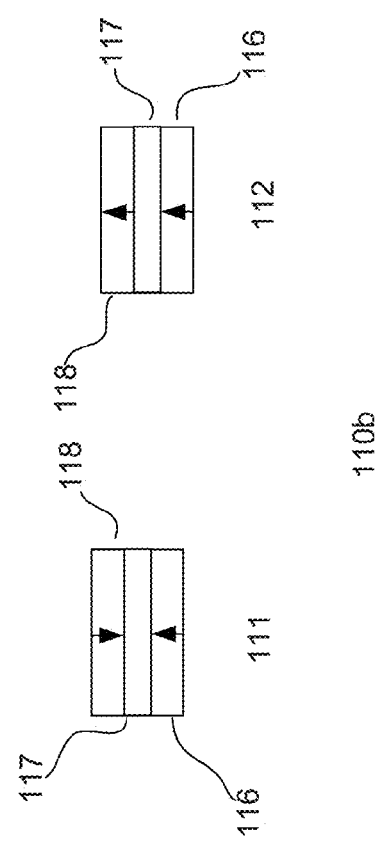

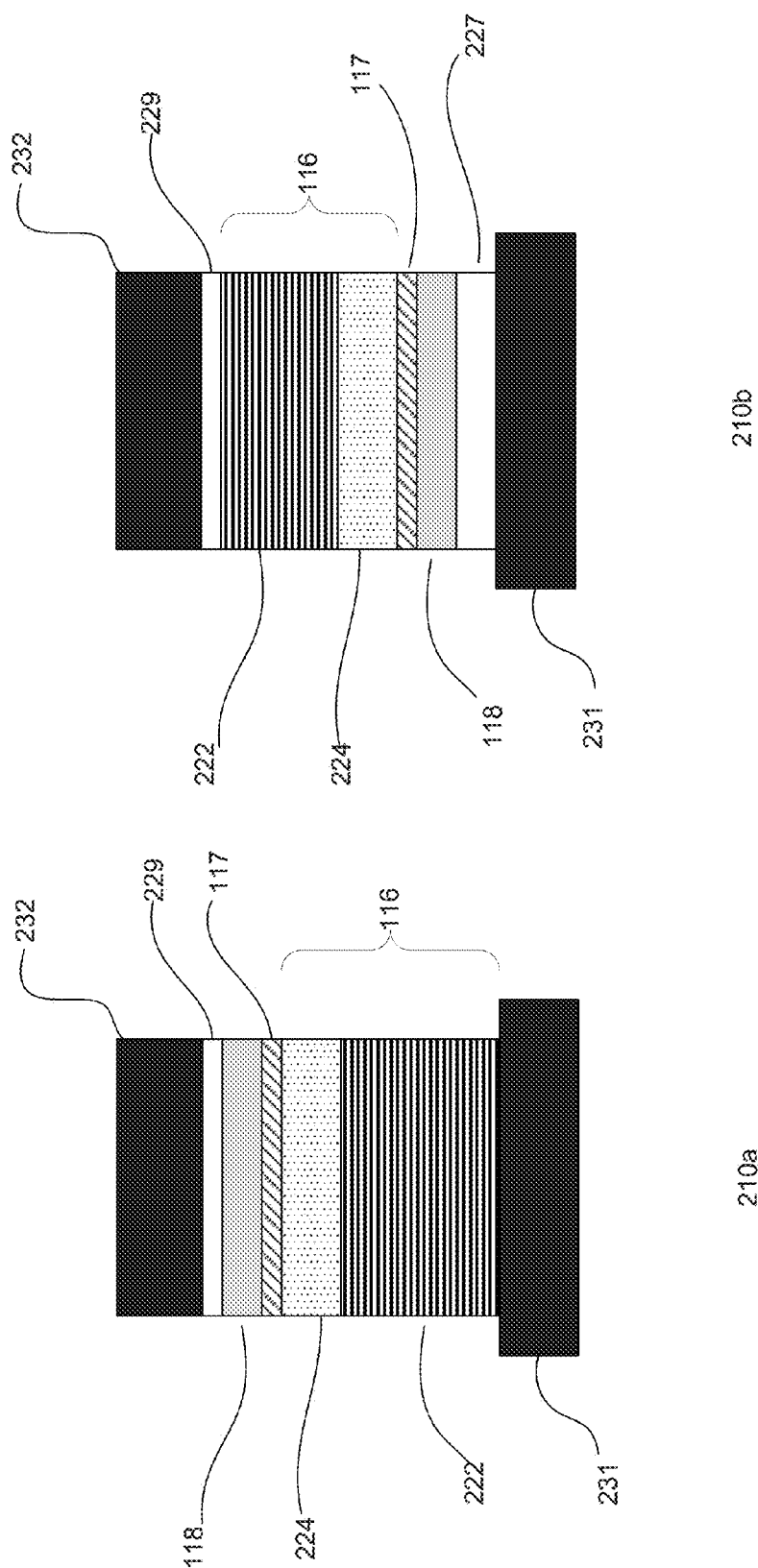

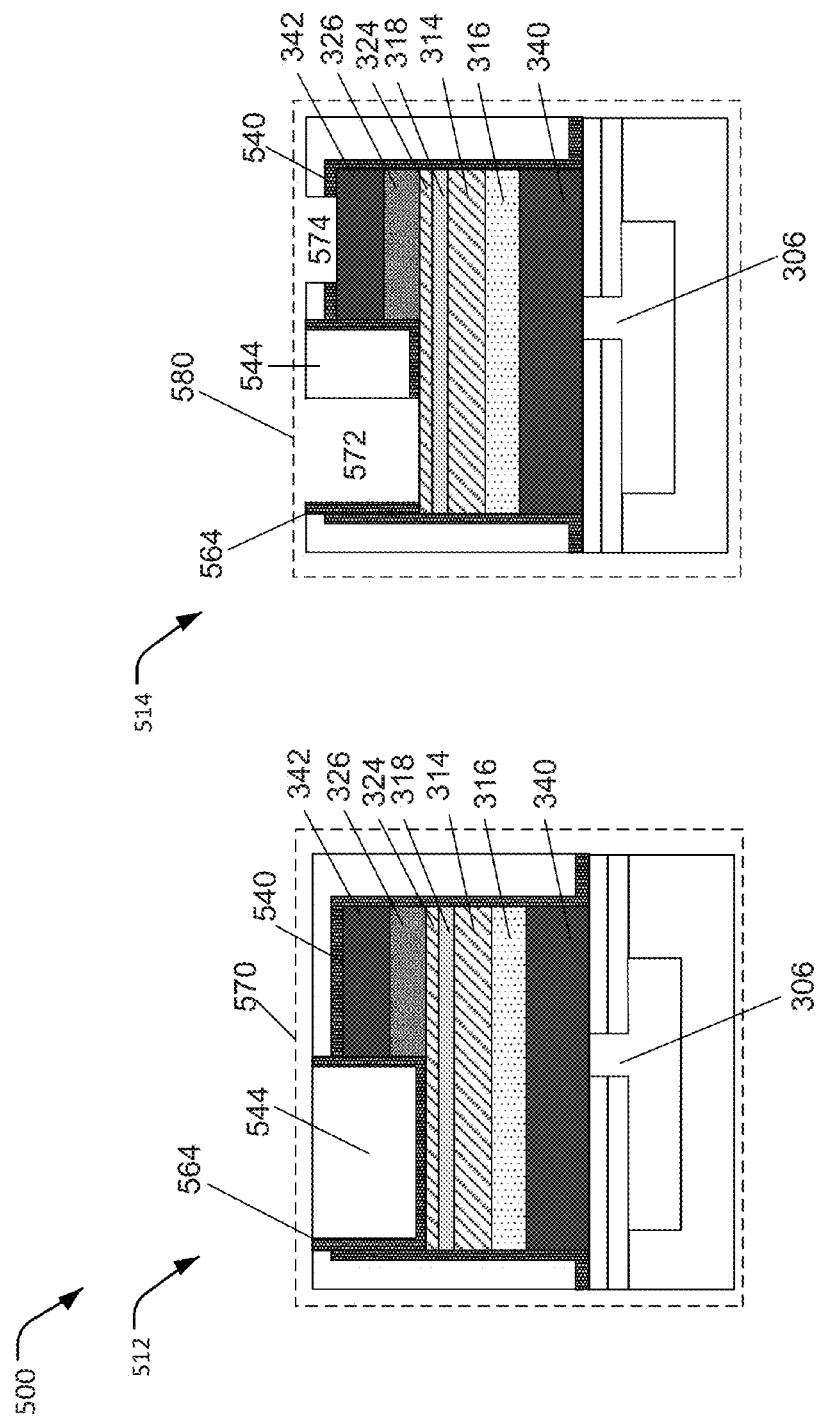

ENERGY EFFICIENT THREE-TERMINAL VOLTAGE CONTROLLED MEMORY CELL

CROSS-REFERENCE TO RELATED APPLICATION

This Application claims the benefit of and priority to U.S. Provisional Patent Application No. 62/074,085, filed Nov. 2, 2014, which is hereby incorporated by reference in its entirety.

BACKGROUND

A magnetic memory cell stores information by changing electrical resistance of a magnetic tunnel junction (MTJ) element. The MTJ element typically includes a fixed (pinned) magnetic layer and a free magnetic layer. The fixed (pinned) magnetic layer and the free magnetic layer are laminated such that a tunnel barrier film is formed between the two layers. The magnetic orientation of the free layer flips by a direction or an opposite direction of electric currents exceeding a critical select current. The electrical resistance of the MTJ element changes corresponding to that of the magnetic orientation of the free layer relating to the fixed magnetic layer, which may be in either a parallel (P) state or an anti-parallel (AP) state.

However, conventional magnetic memory cells require high currents for programming and have slower writing/reading speed. This may result in high power consumption and poor speed performance for many memory applications.

From the foregoing discussion, it is desirable to provide low power memory cells with improved writing/reading performance in memory applications such as portable electronic devices and high-speed nonvolatile memory devices.

SUMMARY

Embodiments of the present disclosure generally relate to semiconductor devices. More particularly, some embodiments relate to memory devices, such as magnetic memory devices. For example, the magnetic memory devices may be magnetoresistive random access memory (MRAM) devices. Such memory devices, for example, may be incorporated into standalone memory devices including, but not limited to, USB or other types of portable storage units, or ICs, such as microcontrollers or system on chips (SoCs). The devices or ICs may be incorporated into or used with, for example, portable consumer electronic products, or relate to other types of devices.

In one embodiment, a memory cell is disclosed. The memory cell includes at least three terminals, a first magnetic tunnel junction (MTJ) structure and a second MTJ structure. The first MTJ is coupled between a first terminal (FT) and a third terminal. A portion of the first MTJ is configured to include a first barrier layer disposed between a first fixed layer and a free layer (FL). A magnetization direction of the FL is used to store data, the magnetization direction being controlled by an electric field. The second MTJ is coupled between the FT and a second terminal, where a portion of the second MTJ is configured to include a second barrier layer disposed between a second fixed layer and the FL, where a tunnel magnetoresistance of the second barrier layer is used to read the data.

In another embodiment, a method of operating a memory cell is presented. The method includes providing a memory cell which includes at least three terminals, a first magnetic tunnel junction (MTJ) structure coupled between a first terminal and a third terminal where a portion of the first MTJ structure is configured to include a first barrier layer disposed between a first fixed layer and a free layer. A request to write the data is received. An electric field is applied across the first terminal and the third terminal in response to the request. The data is written to the free layer, where magnetization direction of the free layer is used to store the data, the magnetization direction being controlled by the electric field. The memory cell is configured to include a second MTJ structure coupled between the first terminal and a second terminal, where a portion of the second MTJ structure is configured to include a second barrier layer disposed between a second fixed layer and the free layer, and where a tunnel magnetoresistance (TMR) of the second barrier layer is used to read the data.

In yet another embodiment, a method for fabricating a memory cell is disclosed. The method includes forming a magnetic tunnel junction (MTJ) stack, where the MTJ stack includes a conductive bottom lead layer coupled to a third terminal. A first fixed layer is formed to cover the conductive bottom lead layer. A first barrier layer is formed to cover the first fixed layer. A free layer is formed to cover the first barrier layer. A second barrier layer is formed to cover the free layer. A second fixed layer is formed to cover the second barrier layer and a conductive top lead layer is formed to cover the second fixed layer. The end portions of the MTJ stack are etched to form a first intermediate MTJ structure. The first intermediate MTJ structure is encapsulated. The end portions of the first intermediate MTJ structure are backfilled. The first intermediate MTJ structure is planarized to form a second intermediate MTJ structure. A side portion of the second intermediate MTJ structure is etched to form a third intermediate MTJ structure, where the etching exposes a portion of the second barrier layer. An exposed portion of the third intermediate MTJ structure is protected by a protective layer. The exposed portion of the third intermediate MTJ structure is filled back to form a fourth intermediate MTJ structure. A first portion of the fourth intermediate MTJ structure is etched to expose a portion of the second barrier layer and a second portion of the fourth intermediate MTJ structure is etched to expose a portion of the conductive top lead layer to form a fifth intermediate MTJ structure. The first portion and the second portion of the fifth intermediate MTJ structure are filled with a conductive material for forming the first terminal and the second terminal respectively.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1b show diagrams of parallel state and anti-parallel state of a MTJ element.

FIGS. 2a-2b show cross-sectional views of embodiments of MTJ elements.

FIGS. 5a-5i illustrate cross sectional views of an embodiment of a process for forming a memory cell.

FIG. 7b is a process flow diagram of a method for fabricating a MTJ stack described in FIG. 7a.

DETAILED DESCRIPTION

Figure 3A:
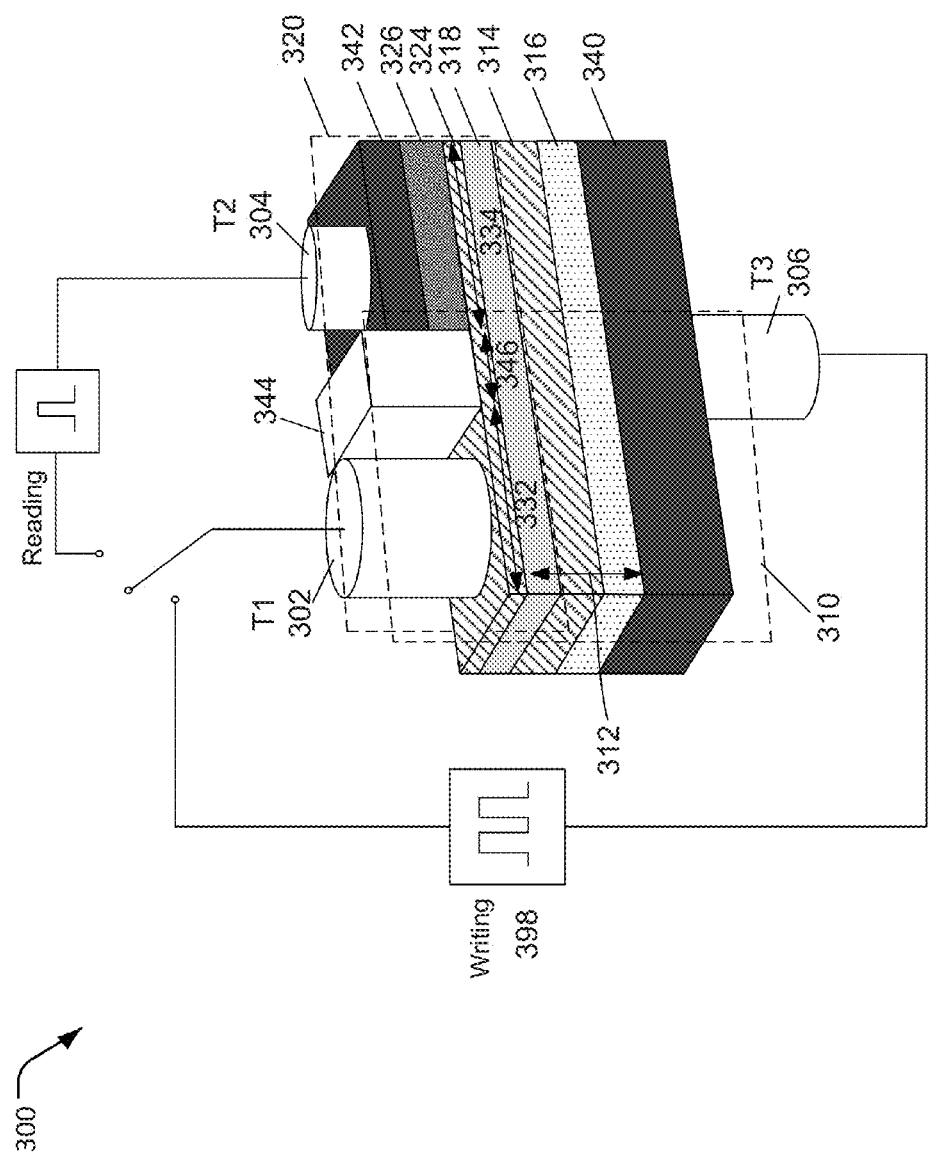
FIG. 3a shows an isometric cross sectional view of an embodiment of a memory cell.

Embodiments of the present disclosure generally relate to memory cells. In one embodiment, the memory cells are magnetic resistive memory cells. Magnetic resistive memory cells include magnetic tunneling junction (MTJ) elements. Other suitable types of resistive memory cells may also be useful. The memory cells are configured to produce fast write time and high sensing margin. The memory cells can be incorporated into or used with, for example, electronic products such as mobile phones, smart card, mass storage, enterprise storage and industrial and automotive products.

FIG. 1a shows a simplified cross-sectional view of an embodiment of a MTJ element 110a. As shown, the magnetization, magnetization direction, or magnetic orientations of the magnetic element is configured to be in the horizontal direction. Horizontal direction, for example, refers to the direction along or parallel to the surface of a substrate. A MTJ element includes a magnetically fixed (pinned) layer 116, a tunneling barrier layer 117 and a magnetically free layer 118. The magnetic orientation of the fixed layer is fixed while the magnetic orientation of the free layer may be programmed to be in a first or same direction as the fixed layer or in a second or opposite direction as the fixed layer. For example, as shown by structure 111, the magnetic direction of the free layer is programmed to be in the first or parallel direction as the fixed layer. The corresponding MTJ electrical resistance between the free layer 118 and the fixed layer 116 is denoted as $R_P$. Structure 112 illustrates that the magnetization of the free layer is programmed to be in a second or anti-parallel direction as the fixed layer. The corresponding MTJ electrical resistance between the free layer 118 and the fixed layer 116 is denoted as $R_{AP}$. The resistance $R_{AP}$ is higher than the resistance $R_P$.

FIG. 1b shoes vertical alignment of magnetic orientations in the magnetic layers of a MTJ element 110b. Vertical, for example, refers to the direction perpendicular to a substrate surface. As shown in FIG. 1b, MTJ element 110b includes a fixed (pinned) layer 116, a barrier layer 117 and a free layer 118. When MTJ element 110b is in magnetic anti-parallel state, magnetic orientations of the free layer 118 and the fixed layer 116 are in opposite directions as shown by structure 111. The corresponding MTJ electrical resistance between the free layer 118 and the fixed layer 116 is denoted as $R_{AP}$. When MTJ element 110b is in a magnetic parallel state, magnetic orientations of the free layer 118 and the fixed layer 116 are in the same direction as shown by structure 112. The corresponding MTJ electrical resistance between the free layer 118 and the fixed layer 116 is denoted as $R_P$.

FIGS. 2a-2b show cross-sectional views of exemplary embodiments of MTJ stacks or elements. FIG. 2a shows a bottom-pinned MTJ element 210a and FIG. 2b shows a top-pinned MTJ element 210b. Top and bottom refer to position of layers relative to the substrate surface.

As shown in FIG. 2a, bottom-pinned MTJ stack 210a includes a bottom electrode 231, a magnetically fixed (pinned) layer 116, a tunneling barrier layer 117, a magnetically free layer 118, a cap layer 229 and a top electrode layer 232 on the cap layer 229. The fixed layer 116, in one embodiment, includes a magnetic layer 224 and a pinning layer 222 on the bottom electrode 231. The pinning layer, for example, pins the magnetization direction of the magnetic layer, forming a pinned layer.

The free layer may be CoFeB, or CoFeB with Co/Pt, Co/Ni, Co/Pd, the tunneling barrier layer may be MgO or $Al_2O_3$, and the fixed layer may be CoFeB/Ru/CoFeB, or CoFeB with Co/Pt, Co/Ni, Co/Pd with synthetic antiferromagnetic (SAF) structure to minimize the static field from the fixed layer. As for the pinning layer and/or pinned layer, [Co/Pt]m, [Co/Ni]n, or other materials with perpendicular magnetic anisotropy (PMA) may be used. The top and bottom electrodes may be TaN or Ta. Other suitable configurations or materials for the MTJ stack may also be useful.

As shown in FIG. 2b, top-pinned MTJ stack 210b includes a bottom electrode 231, a buffer layer 227, a free layer 118, a tunneling barrier layer 117, a fixed layer 116, a cap layer 229 and a top electrode layer 232 on the cap layer 229. The fixed layer 116, in one embodiment, includes a magnetic layer 224 and a pinning layer 222. The pinning layer, for example, pins the magnetization direction of the magnetic layer, forming a pinned layer.

The free layer may be CoFeB, or CoFeB with Co/Pt, Co/Ni, Co/Pd, the tunneling barrier layer may be MgO or $Al_2O_3$, and the fixed layer may be CoFeB/Ru/CoFeB, or CoFeB with Co/Pt, Co/Ni, Co/Pd with synthetic antiferromagnetic (SAF) structure to minimize the static field from the fixed layer. As for the pinning layer and/or pinned layer, [Co/Pt]m, [Co/Ni]n, or other materials with PMA may be used. The top and bottom electrodes may be TaN or Ta and the buffer layer may be Ru. The buffer layer, for example, serves to prevent diffusion of the material of the bottom electrode into the tunneling barrier layer. Other suitable configurations or materials for the MTJ stack may also be useful.

FIG. 3a shows an isometric cross sectional view of an embodiment of a memory cell 300. The memory cell is a non-volatile memory cell. For example, the memory cell may be a magnetic memory cell. In one embodiment, the memory cell is a Magnetic Random Access Memory (MRAM) cell. Other suitable types of memory cells may also be useful. In the depicted embodiment, the memory cell 300 includes at least three terminals, a first magnetic tunnel junction (MTJ) structure 310 and a second MTJ structure 320. In an embodiment, the terminals include at least a first terminal T1 302, a second terminal T2 304, and a third terminal T3 306.

Figure 3B:
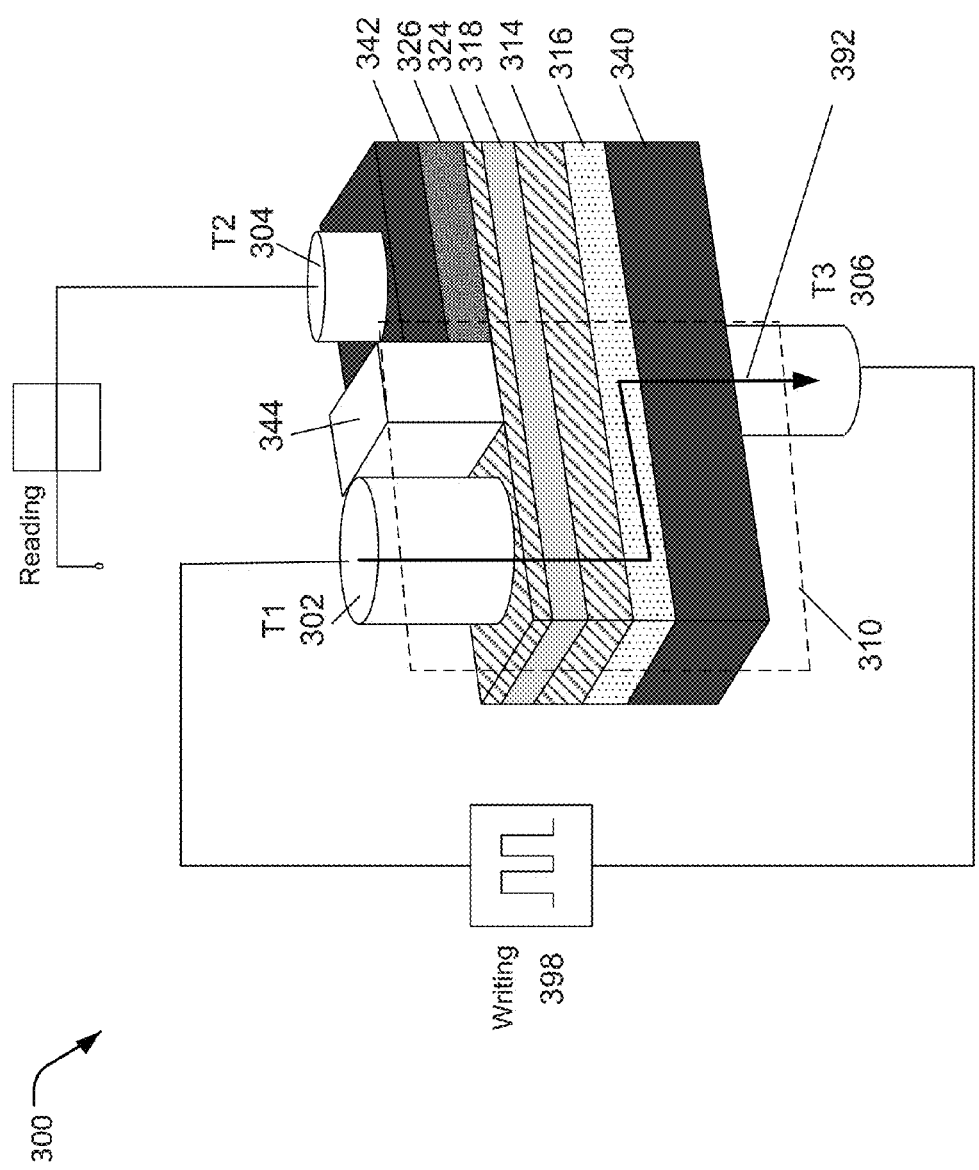
FIGS. 3b-3c illustrate write and read operations of an embodiment of a memory cell.
Figure 3C:
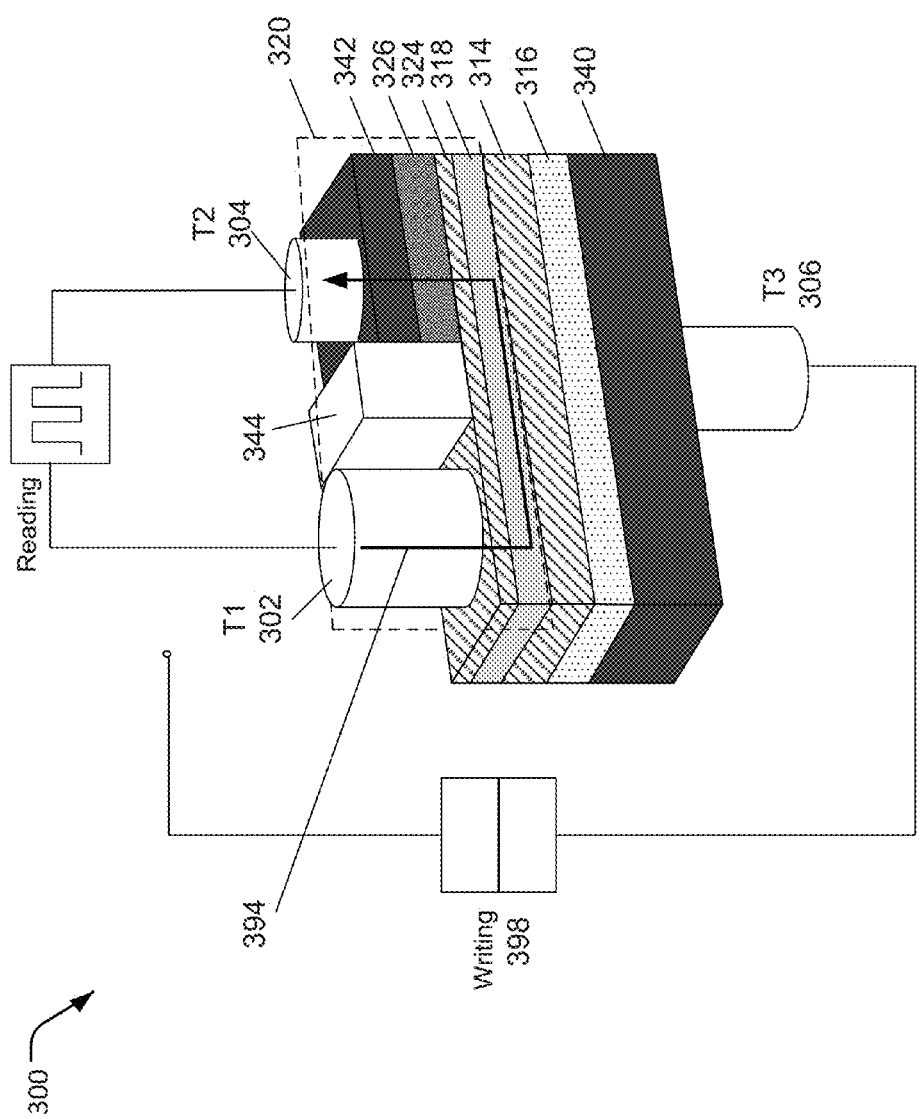

Operating the memory cell 300 may include performing write and read operations. FIG. 3b shows an exemplary write electrical path 392 between T1 and T3 terminals of the memory cell 300. FIG. 3c shows an exemplary read electrical path 394 between T1 and T2 terminals of the memory cell 300. Common elements may not be described or described in detail. Referring to FIGS. 3a, 3b and 3c, the first MTJ structure 310 may be optimized to perform a write operation for storing data in the memory cell 300. An exemplary write electrical path 392 between T1 302 and T3 306 may be used to perform the write operation to store the data. The second MTJ structure 320 may be optimized to perform a read operation for reading the data stored in the memory cell 300. An exemplary read electrical path 394 between T1 302 and T2 304 may be used to perform the read operation. In an embodiment, portions of the first and second MTJ structures 310, 320 may be implemented using MTJ elements described with reference to FIGS. 1a, 1b, 2a and 2b.

In the depicted embodiment, the memory cell 300 may be configured as a thin-film multilayer stack that includes the following layers: a conductive bottom lead layer 340 coupled to T3 306, a first fixed layer 316 formed to cover the conductive bottom lead layer 340, a first barrier layer 314 disposed between the first fixed layer 316 and a free layer 318, a second barrier layer 324 formed to cover the free layer 318, where a portion of the second barrier layer 332 is coupled to T1 302, a conductive top lead layer 342 coupled to T2 304, and a second fixed layer 326 disposed below the conductive top lead layer 342. A spacer 344 is configured to insulate the conductive plug (e.g., T1 302) from 2 layers—the conductive top lead layer 342 and the second fixed layer 326. The spacer 344 is also configured to cover a center portion 346 of the second barrier layer 324. The conductive plug (e.g., T1 302) and the second fixed layer 326 are configured to respectively cover the remaining end portions 332 and 334 of the second barrier layer 324. The conductive plug (e.g., T1 302) may metallize the end portion 332 of the second barrier layer (e.g., 1 nm or less, depending on the etching process control) and may cause this end portion of the second barrier layer to be conductive.

The write electrical path 392 enables an electrical signal to flow from T1 302 through the first magnetic tunnel junction (MTJ) structure 310 to T3 306 to perform the write operation. A portion 312 of the first MTJ structure 310 is configured to include the first barrier layer 314 disposed between the first fixed layer 316 and the free layer 318. The conductive plug (e.g., T1 302) is coupled to the first MTJ structure 310 and the conductive plug (e.g., T3 306) is coupled to the conductive bottom lead layer 340. The first fixed layer 316 is configured to cover the conductive bottom lead layer 340. The conductive plug (e.g., T1 302) is configured to cover a first portion 332 of the second barrier layer 324. A direction of the write electrical path 392 is configured to be perpendicular to the free layer 318.

The read electrical path 394 enables an electrical signal to flow from T1 302 through the second magnetic tunnel junction (MTJ) structure 320 to T2 304 to perform the read operation. A portion of the second MTJ structure 320 is configured to include the second barrier layer 324 disposed between the second fixed layer 326 and the free layer 318. The conductive top lead layer 342 is configured to cover a second portion 334 of the second barrier layer 324. One or more components such as the conductive plug (e.g., T1 302), the second barrier layer 324 and the free layer 318 may be common to the first and second MTJ structures 310, 320. A direction of the read electrical path 394 is configured to be in plane with the free layer 318. A logic 1 or 0 value of the data stored in the free layer 318 may be determined by determining whether the resistance (between T1 and T2) is equal to $R_{AP}$ or $R_P$.

In an embodiment, the free layer 318 may be formed by using CoFeB material, the first barrier layer 314 may be formed by using MgO material, the first fixed layer 316 may be formed using CoFe (or Co, Fe) material. The second barrier layer 324 may be formed using oxide materials such as MgO or $Al_2O_3$. The second fixed layer 326 may be formed using [Co/Pt]m, [Co/Pt]n, or other materials with PMA. The conductive lead layers 340 and 342 may be formed using Ta or TaN material while the conductive plugs (e.g., T1 302, T2 304 and T3 306) may be formed using Cu. Forming the conductive lead layers and conductive plugs using different conductive materials may also be useful. The spacer 344 may be formed using an insulating material such as silicon nitride (SiN). Other suitable configurations or materials for the memory cell 300 may also be useful.

In an embodiment, a magnetization direction, e.g., P or AP, of the free layer 318 may be used to store data, the magnetization direction being controlled by an electric field rather than by using spin-transfer torque (STT) effect. The electric field is generated across ferromagnetic/metal and ferromagnetic/oxide insulator interfaces by applying a voltage 398 between T1 302 and T3 306. Therefore, the voltage 398 may be used to control the magnetization direction in the free layer 318 to align with a P or AP direction to the fixed layer. A tunnel magnetoresistance (TMR) property of the second barrier layer 324 may be used to read the data stored in the free layer 318.

The electric field can modify the electric properties of certain magnetic thin films (e.g., the free layer) by changing the electron density at the Fermi energy level. The effect of changing interfacial magnetic anisotropy using an electric field is known as voltage induced precessional dynamic switching. This effect is present near the ferromagnetic/metal and ferromagnetic/oxide insulator interfaces such as between the first fixed layer 316, the first barrier layer 314, and the free layer 318 in the first MTJ structure 310 that may use CoFeB/MgO/CoFeB materials. Thus, voltage induced precessional dynamic switching occurs due to the change of perpendicular magnetic anisotropy (PMA) under electric field effect. The demonstrated current amplitude in the case of voltage induced precessional dynamic switching is one or two-orders of magnitude smaller than STT induced switching.

In the case where the first fixed layer 316 is CoFe or CoFeB, a layer of tantalum (Ta) between CoFe or CoFeB and MgO may be added as a seed layer for MgO crystallization. The thick CoFe or CoFeB layer provides a self-biased magnetization field for free layer 318 precession. Bias voltage 398 modifies the PMA of the free layer 318, thus free layer magnetization is changed from a direction perpendicular to plane to an in plane direction and starts dynamic precession. Ta material may also exhibit improved roughness control at the tunnel-barrier interfaces, etch resistance and thermal stability, and may promote high PMA in the free layer 318.

Switching current density, hence switching energy, required to switch magnetization direction in the free layer 318 using voltage induced precessional dynamic switching is, for example, about 0.01 $MA/cm^2$. Other suitable switching current density may also be useful. This current density is significantly less compared to current induced magnetization switching that uses about 1-5 $MA/cm^2$ using the STT induced magnetization switching. Thus, switching energy used for the voltage induced precessional dynamic switching is an order of magnitude smaller compared to STT and is typically measurable in femto Joules (fJ). In addition, switching time using voltage induced precessional dynamic switching is less than 1 ns compared to a switching time of at least 3 ns using current induced switching.

The writing path 392 is active and the read path 394 is inactive in a write operation. The write path 392 is inactive and the read path 394 is active in a read operation. Separation of writing and reading portions of the memory cell 300, e.g., the writing path 392 formed in the first MTJ structure 310 and the reading path 394 formed in the second MTJ structure 320, provides improved design flexibility and provides more options for material selection. Also, separation of the writing and reading portions of the memory cell 300 enables optimization of both writing and reading functionality independently and simultaneously. For example, the write operation is optimized to use less energy for writing by eliminating use of spin-torque-driven magnetization techniques that use more switching energy. Thickness of the first barrier layer may be optimized for performing the write operation and a thickness of the second barrier layer may be optimized for performing the read operation. Configuring a thick first barrier layer, e.g. MgO, having a thickness of 2-5 nm, allows applying sufficiently high voltage (e.g., about 1 V) to reduce PMA of the free layer that also reduces the current amplitude to save energy. Other suitable thickness may also be useful.

A thin second barrier layer, which may be formed by an oxide material different than MgO, may be optimized or configured to have a thickness of 1 nm. Configuring the thin second barrier layer to other suitable thickness may also be useful. The thin barrier layer provides a high TMR value for performing the read operation. Reading/sensing mechanism senses a TMR resistance that is high (low) when magnetization of the free layer is anti-parallel (parallel) with that of the second fixed layer. The thicker first barrier layer may be optimized for the write operation and its thickness has no effect on the read performance of the memory cell 300 since the first barrier layer is completely excluded or bypassed from the read path 394. The resistance of the thin second barrier layer is smaller than the resistance of the thicker first barrier layer by a factor of 100 to 1000. Time to perform a read operation is about 4 ns, which is significantly less than that of MTJ devices having a single MgO oxide layer with a thickness of 2-5 nm that may be used for write and read operations.

Figure 4:
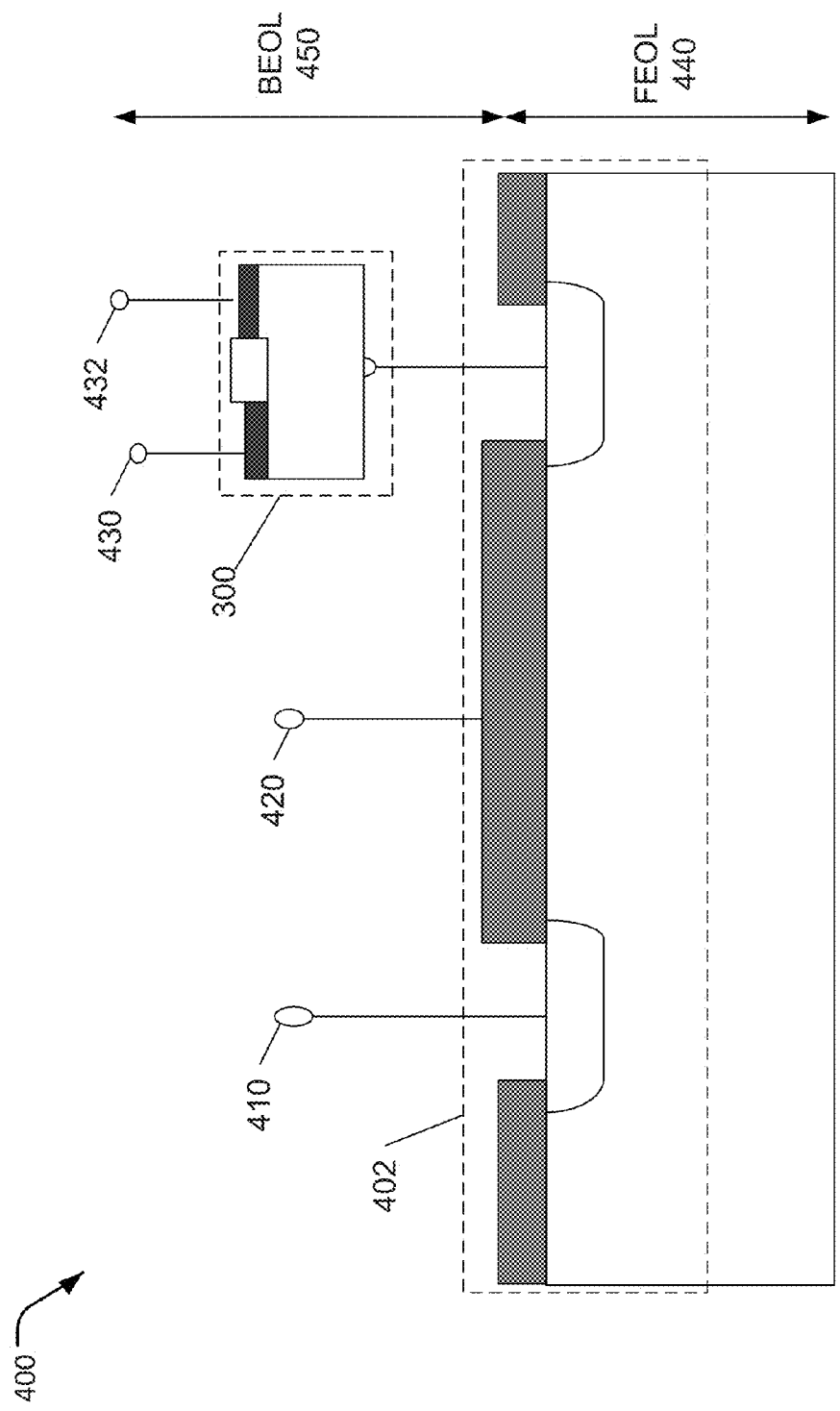
FIG. 4 shows a cross sectional view of a portion of a memory cell that includes a selection transistor and another memory cell.

FIG. 4 shows a cross sectional view of a portion of a memory cell 400 that includes a selection transistor 402 and the memory cell 300 described with reference to FIGS. 3a, 3b and 3c. The memory cell 400 includes 4 terminals connected to source line (SL) 410, word line (WL) 420 and 2 bit lines (BL1 430, BL2 432). BL1 corresponds to T1 302, BL2 corresponds to T2 304 and drain node corresponds to T3 306. WL 420 is typically connected to the gate node of the selection transistor 402 to control the conductivity of the transistor 402. The memory cell 300 and the selection transistor 402 are connected in series. The memory device 300 is arranged between the BL1/BL2 and the selection transistor 402. The source node of the selection transistor 402 is connected to SL.

The selection transistor 402 is typically fabricated as a portion of a front end of line (FEOL) structure 440 of an IC and the memory cell 300 is typically fabricated as a portion of a back end of line (BEOL) structure 450 of the IC. It is understood that the memory cell 400 may include additional FEOL elements (not shown), additional BEOL elements (not shown) and additional back end (or post fab) process elements (not shown) such as contact pads. BEOL may include a plurality of interlevel dielectric ILD layers.

Materials used for forming FEOL and BEOL structures may include a semiconductor substrate such as silicon substrate, doped substrates such as silicon-germanium (SiGe), germanium (Ge), gallium-arsenic (GaAs) and other suitable semiconductor materials, a crystalline-on-insulator (COI) substrate. An insulator layer, for example, may be formed of a low-k dielectric insulating material such as silicon oxide. Other types of dielectric insulating materials may also be useful. Conductive layers may be formed of a metal, such as copper, copper alloy, aluminum, tungsten or a combination thereof. A passivation or protection layer may be formed to protect the devices. The passivation layer may be formed using SiN material. An encapsulation layer may be formed by using polysilicon material. Other materials may also be useful for forming the multilayer thin-film structures of the memory cell 400.

In an embodiment, SL 410 may be arranged below the memory cell 300 to achieve a more relaxed layout pattern in the memory device 400. BL1/BL2 may be arranged in the upper metal layer of the memory device 400. It is contemplated that multiple ones of the memory cell 400 described with reference to FIG. 4 may be arranged to form a memory array (not shown).

FIGS. 5a-5i shows cross sectional views of an embodiment of a process 500 for forming a memory cell. The cell formed is similar or the same as the memory cell 300 described with reference to FIGS. 3a, 3b, and 3c and the memory cell 400 described with reference to FIG. 4. Thus, common elements and elements having same reference numerals may not be described or described in detail. The process 500 may include using one or more unit processes including dielectric deposition, lithography, etching, physical vapor deposition (PVD) or chemical vapor deposition (CVD) metal deposition, plating (e.g., electro or electroless), and CMP to fabricate FEOL and BEOL structures of the multilayer thin-film memory cell. Other techniques may also be useful for forming the multilayer thin-film structures.

Figures 5A, 5B:
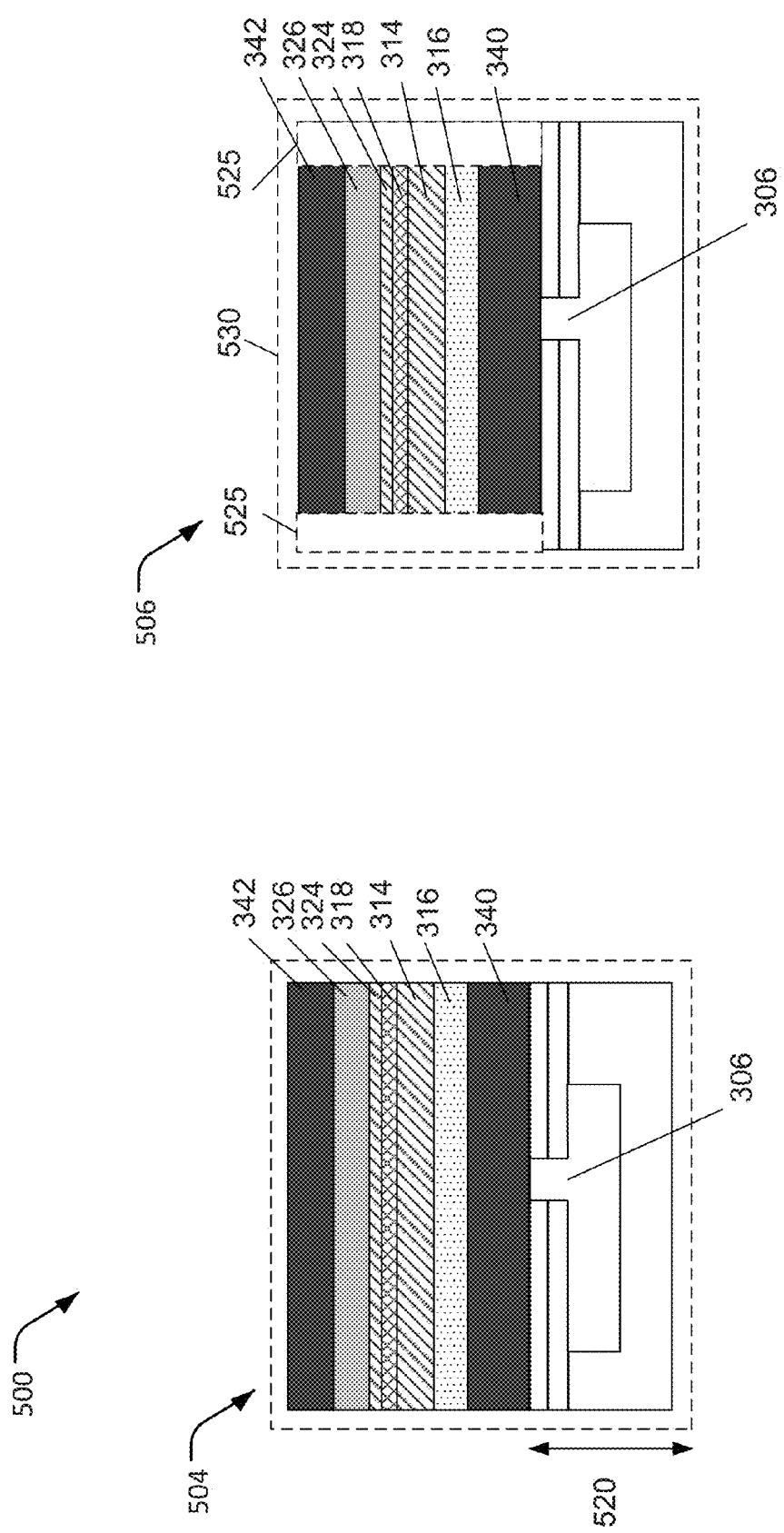

FIG. 5a illustrates a process 504, in which a MTJ stack that includes multiple thin-film layers is formed as follows. The MTJ stack, for example, may be formed in ILD level in between metal level M4 and metal level M5. Forming the MTJ stack in between other metal levels may also be useful. As shown, an interlevel dielectric (ILD) layer 520 having a coplanar surface is formed. The ILD layer includes a portion of third terminal T3 disposed over metal level M4. A conductive bottom lead layer 340 is formed to cover the coplanar surface, thereby making an electrical contact with T3 terminal 306. A first fixed layer 316 is formed to cover the conductive bottom lead layer, a first barrier layer 314 is formed to cover the first fixed layer and a free layer 318 is formed to cover the first barrier layer. A second barrier layer 324 is formed to cover the free layer, a second fixed layer 326 is formed to cover the second barrier layer and a conductive top lead layer 342 is formed to cover the second fixed layer 326. The MTJ stack may be formed using one or more deposition processes such as PVD or CVD. The various layers may include any suitable thickness dimensions and may be formed by other suitable techniques.

Figure 5D:
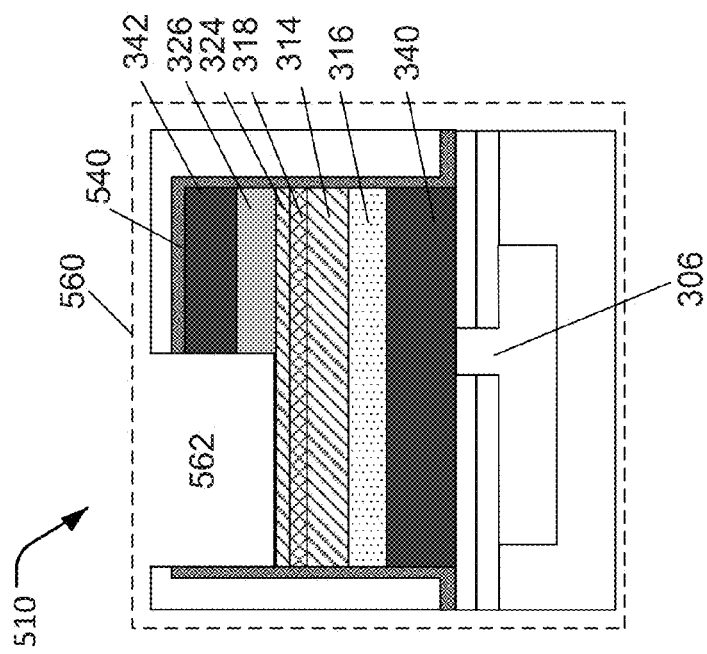
Figure 5C:
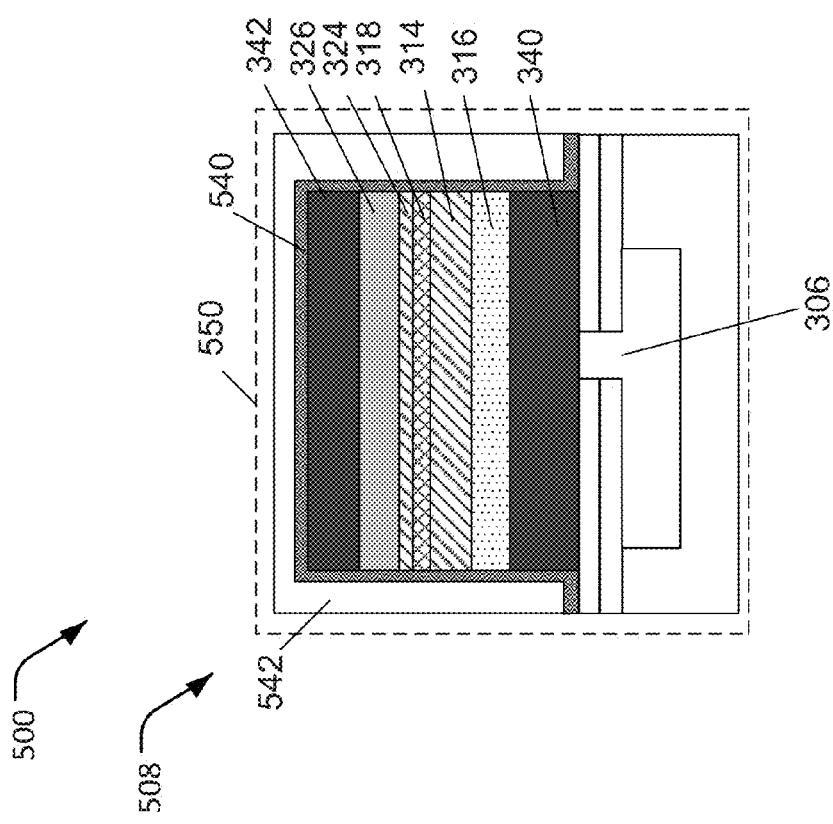

FIG. 5b illustrates a process 506, in which photoresist masking and etching may be used to pattern and remove end portions 525 of the MTJ stack to form a first intermediate MTJ structure 530. FIG. 5c illustrates a process 508, in which the first intermediate MTJ structure is protected by a first protective layer 540, the end portions of the MTJ stack are backfilled by an insulating material 542 (e.g., a dielectric layer) and the MTJ stack is planarized to form a second intermediate MTJ structure 550. FIG. 5d illustrates a process 510, in which a side portion 562 of the second intermediate MTJ structure is etched to form a third intermediate MTJ structure 560. This is achieved by using suitable mask and etch techniques, where the etch forms an opening and exposes a portion of the second barrier layer 324. FIG. 5e illustrates a process 512, in which an exposed portion or the opening of the third intermediate MTJ structure is provided and lined. with a second protective layer 564 and an insulating material 544 is provided to fill the opening and covers the MTJ structure. A CMP process is performed to remove excess insulating material 544 and portions of the second protective layer overlying the insulating material to form a fourth intermediate MTJ structure 570 having a planar top surface.

Figure 5H:
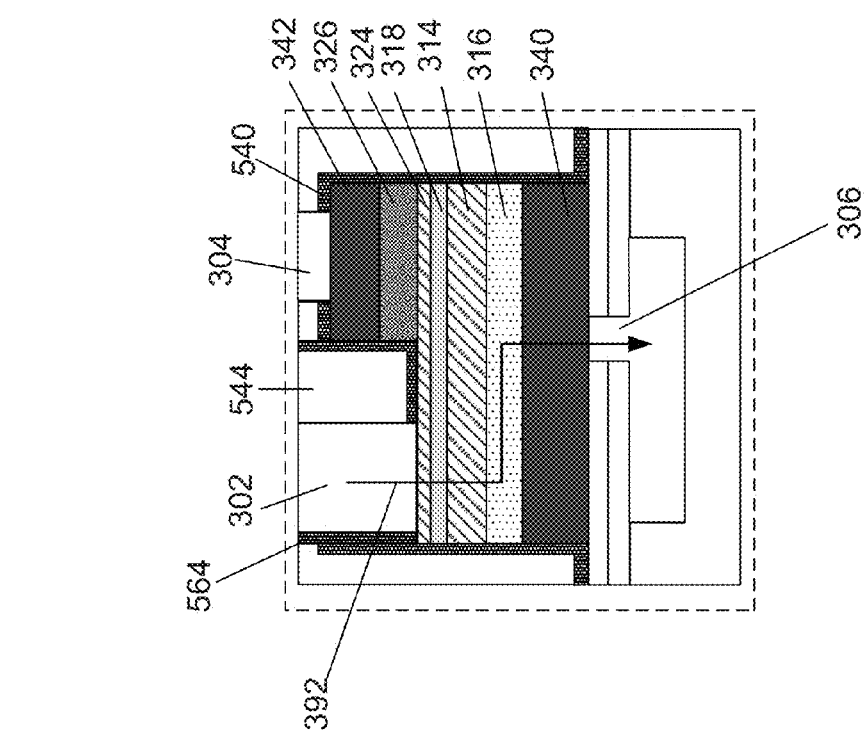
Figure 5G:
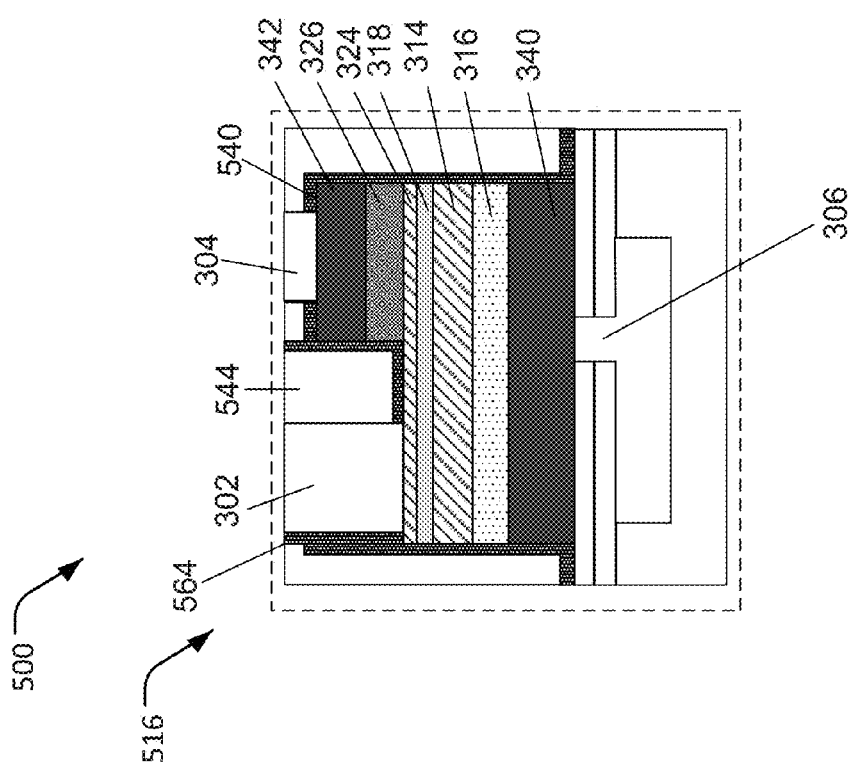
Figure 5I:
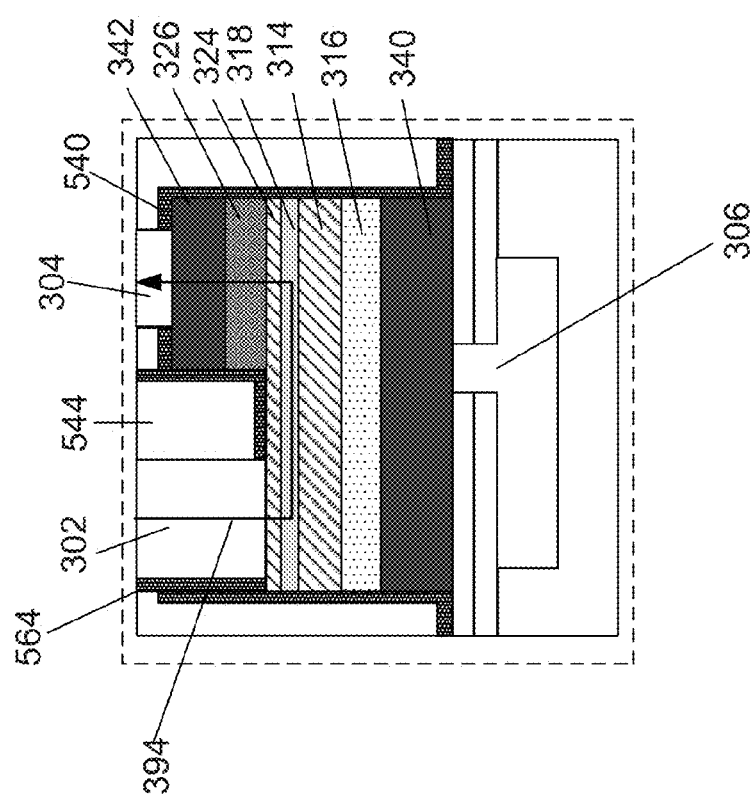

FIG. 5*f* illustrates a process 514, in which a first portion 572 of the fourth intermediate MTJ structure is etched to form an opening which exposes a portion of the second barrier layer 324 and a second portion 574 of the fourth intermediate MTJ structure is etched to form another opening to expose a portion of the conductive top lead layer 342 to form a fifth intermediate MTJ structure 580. This is achieved using suitable mask and etch technique. FIG. 5*g* illustrates a process 516, in which the openings of the fifth intermediate MTJ structure are filled with a conductive material for forming conductive plugs corresponding to the first terminal T1 302 and the second terminal T2 304 respectively, thereby forming the memory cell 300 which is the same as that described and shown in FIGS. 3*a*, 3*b* and 3*c*. After the first portion 572 is removed to form an opening and after the second portion 574 is removed to form another opening in process 514, conductive material (e.g., Cu) may be filled in the openings (e.g., by ECP) followed by CMP to remove the excess conductive material to form conductive plugs 302 and 304. FIG. 5*h* illustrates an exemplary write path 392 between voltage terminals T1 and T3 during a write operation of the memory cell. FIG. 5*i* illustrates an exemplary read path 394 between voltage/current terminals T1 and T2 during a read operation of the memory cell.

Figure 6:
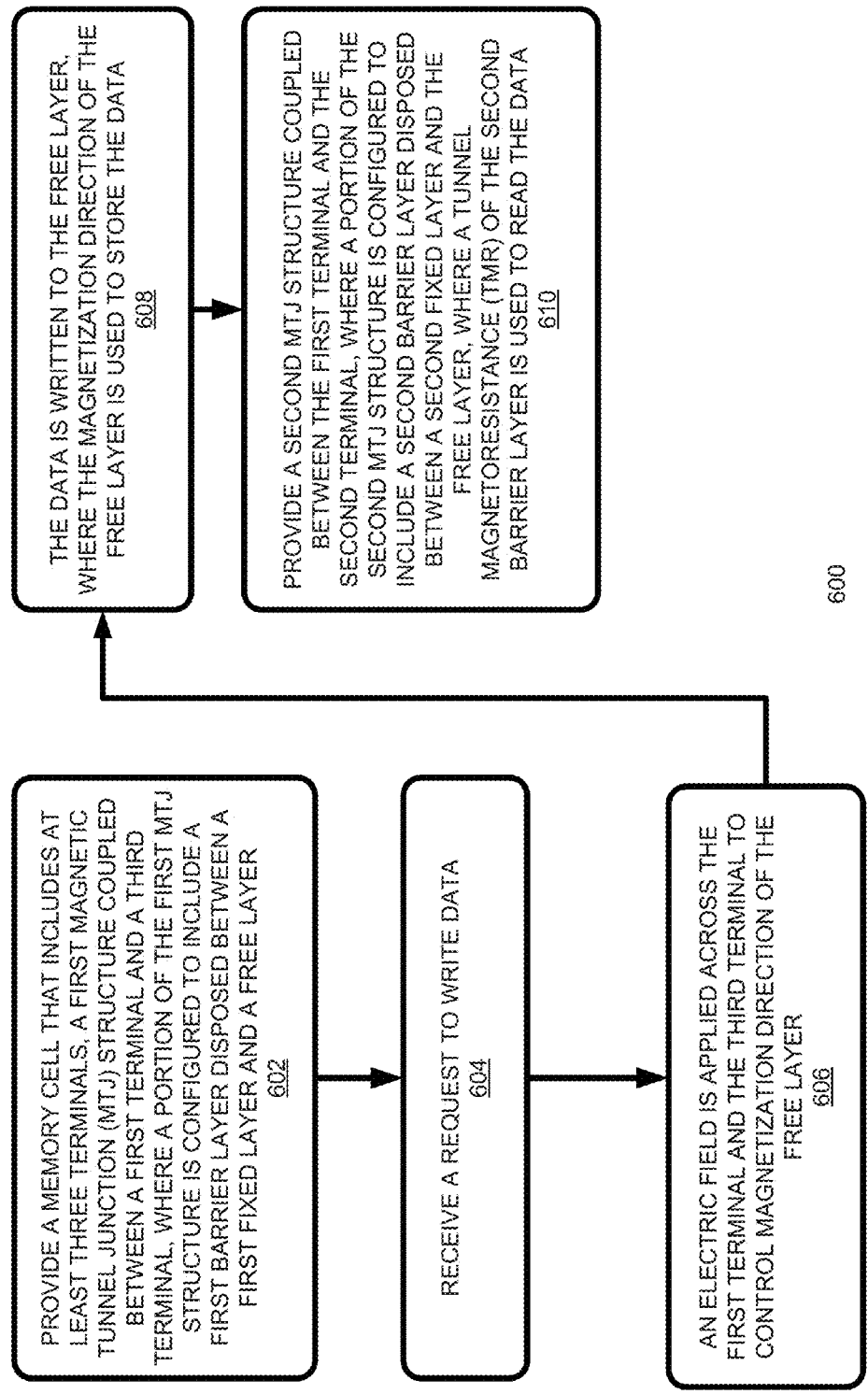
FIG. 6 is a process flow diagram of a method for operating a memory cell.

FIG. 6 is a process flow diagram of a method 600 for operating a memory cell. The cell is similar or the same as the memory cell 300 described with reference to FIGS. 3*a*, 3*b*, and 3*c* and the memory cell 400 described with reference to FIG. 4. At process 602, a memory cell is provided. The memory cell includes at least three terminals, a first magnetic tunnel junction (MTJ) structure coupled between a first terminal and a third terminal, where a portion of the first MTJ structure is configured to include a first barrier layer disposed between a first fixed layer and a free layer. At process 604, a request to write the data is received. At process 606, an electric field is applied across the first terminal and the third terminal in response to the request. At process 608, the data is written to the free layer, where magnetization direction of the free layer is used to store the data, the magnetization direction being controlled by the electric field. At process 610, the memory cell is further configured to include a second MTJ structure coupled between the first terminal and a second terminal, where a portion of the second MTJ structure is configured to include a second barrier layer disposed between a second fixed layer and the free layer, and where a tunnel magnetoresistance (TMR) of the second barrier layer is used to read the data.

Figure 7A:
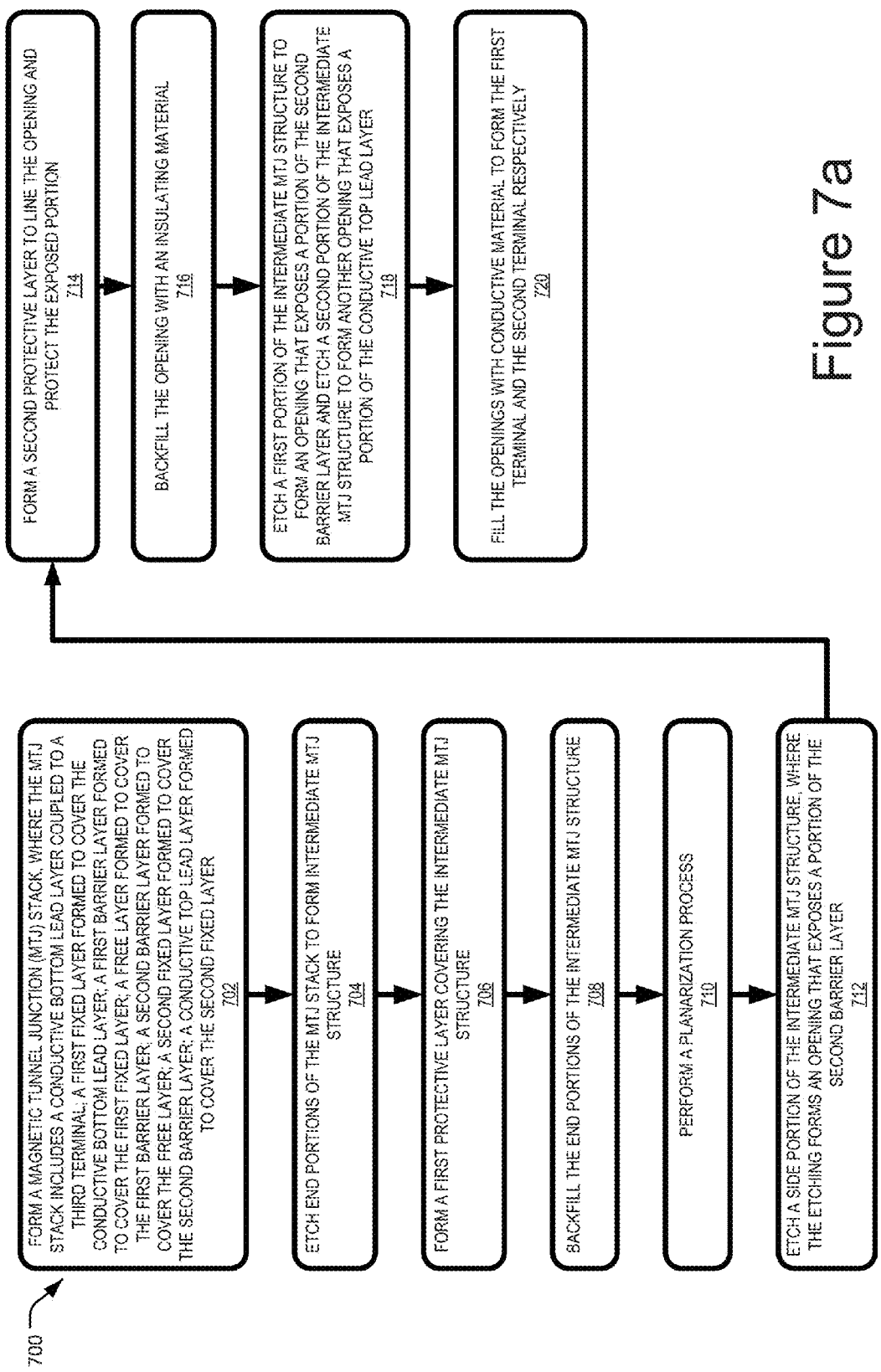
FIG. 7a is a process flow diagram of a method for fabricating a memory cell.

FIG. 7*a* is a process flow diagram of a method 700 for fabricating a memory cell. The cell formed is similar or the same as the memory cell 300 described with reference to FIGS. 3*a*, 3*b*, and 3*c* and the memory cell 400 described with reference to FIG. 4. At process 702, a magnetic tunnel junction (MTJ) stack is formed, where the MTJ stack includes a conductive bottom lead layer coupled to a third terminal; a first fixed layer is formed to cover the conductive bottom lead layer; a first barrier layer is formed to cover the first fixed layer; a free layer is formed to cover the first barrier layer; second barrier layer is formed to cover the free layer; a second fixed layer is formed to cover the second barrier layer; a conductive top lead layer is formed to cover the second fixed layer. At process 704, end portions of the MTJ stack are etched to form an intermediate MTJ structure. At process 706, the MTJ structure is encapsulated. At process 708, end portions of the MTJ stack are backfilled with an insulating material or dielectric layer. At process 710, the MTJ stack is planarized. At process 712, a side portion of the MTJ structure is etched to form an opening, where the etching exposes a portion of the second barrier layer. At process 714, the opening and exposed portions are encapsulated. At process 716, the opening is filled with an insulating material or dielectric layer and planarization process is performed to form a planar top surface. At process 718, a first portion of the MTJ structure is etched to form an opening which exposes a portion of the second barrier layer and a second portion of the MTJ structure is etched to form an opening which exposes a portion of the conductive top lead layer. At process 720, the openings are filled with a conductive material to form the first terminal and the second terminal respectively. For example, a conductive material (e.g., Cu) may be filled into the openings (e.g., by ECP) followed by CMP to remove the excess material to form the first and second terminals.

Figure 7B:
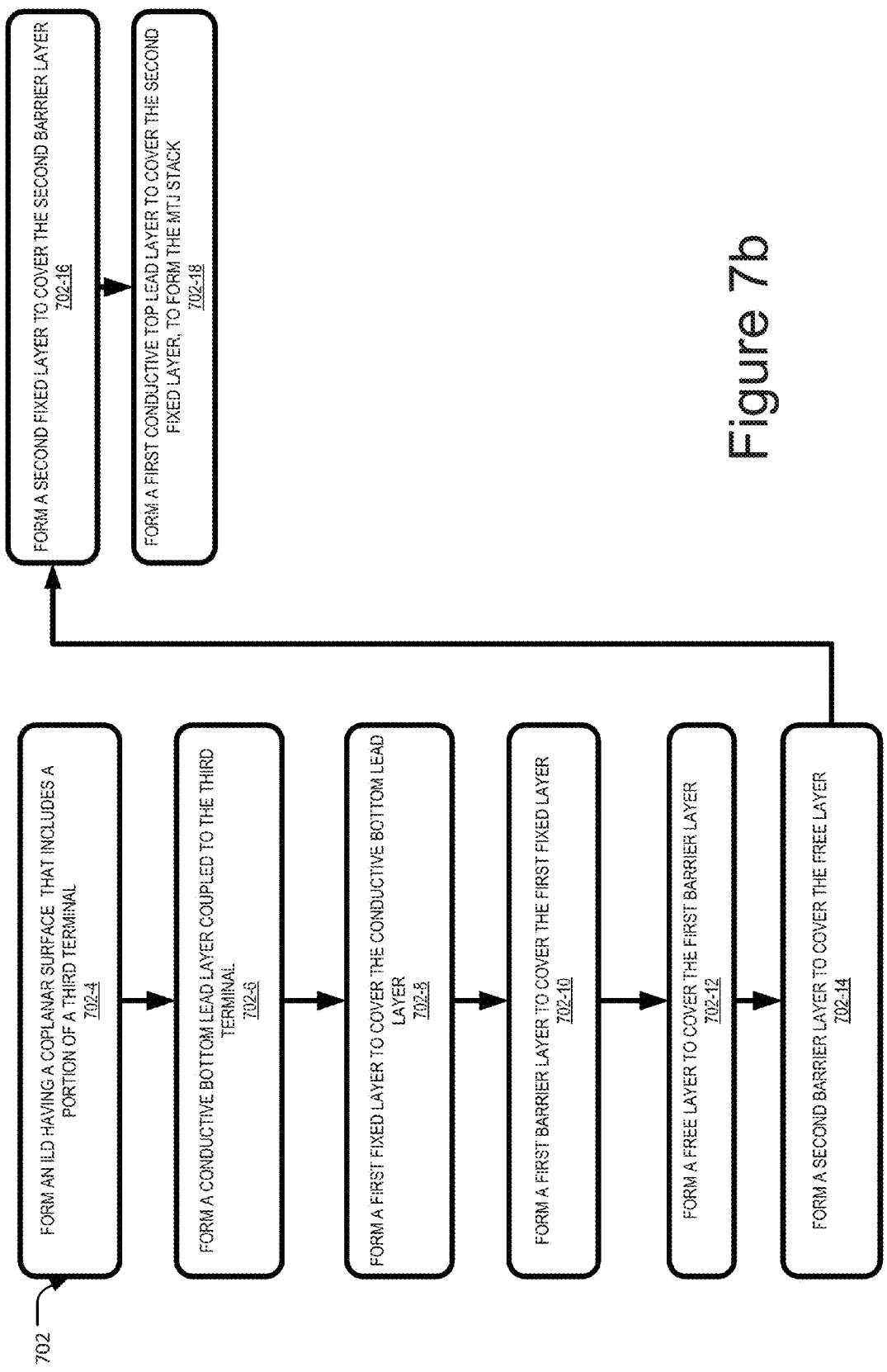

FIG. 7*b* is a process flow diagram of a method for fabricating a MTJ stack described in process 702. At process 702-4, an ILD 520 having a coplanar surface that includes a portion of third terminal T3 is formed. At process 702-6, a conductive bottom lead layer is formed to cover the ILD structure, the conductive bottom lead layer being coupled to the T3. At process 702-8, a first fixed layer is formed to cover the conductive bottom lead layer. At process 702-10, a first barrier layer is formed to cover the first fixed layer. At process 702-12, a free layer is formed to cover the first barrier layer. At process 702-14, a second barrier layer is formed to cover the free layer. At process 702-16, a second fixed layer is formed to cover the second barrier layer. At process 702-18, a conductive top lead layer is formed to cover the second fixed layer, to form the MTJ stack.

It is understood that the order in which the processes 500, 600, 700 or 702 method described herein are illustrative and not intended to be construed as a limitation, and any number of the described process blocks can be combined in any order to implement the process, method or alternate method. Additionally, individual blocks may be deleted from the process without departing from the spirit and scope of the subject matter described herein.

The embodiments as described above result in advantages. As shown in FIGS. 3*a*, 3*b*, 3*c*, and 4, the read and write paths are optimized for design flexibility and material selection in an independent and simultaneous manner. The operation is achieved using voltage induced precessional dynamic switching for writing data. This switching technique uses less energy for writing that is typically measurable in femto Joules (fJ) compared to using spin-torque-driven magnetization techniques that uses more switching energy. Slower read response associated with the voltage induced precessional dynamic switching is eliminated by providing a separate read path. Thickness of the first barrier layer (used for writing data) may be optimized for performing the write operation in, e.g., about 1 ns and a thickness of the second barrier layer (used for reading data) may be optimized for performing the read operation in, e.g., about 4 ns. Oxide materials used for forming the first and second barrier layers may also be different, allowing flexibility in processing.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A memory cell comprising:
    at least three terminals including first, second, and third terminals;
    a first magnetic tunnel junction (MTJ) structure coupled between the first terminal and the third terminal, wherein a portion of the first MTJ structure is configured to include a first barrier layer disposed between a first fixed layer and a free layer, wherein magnetization direction of the free layer is used to store data, the magnetization direction being controlled by an electric field;
    a second MTJ structure coupled between the first terminal and the second terminal, wherein a portion of the second MTJ structure is configured to include a second barrier layer disposed between a second fixed layer and the free layer, wherein a tunnel magnetoresistance (TMR) of the second barrier layer is used to read the data, wherein the first terminal comprises a first conductive plug which covers a first portion of the second barrier layer;
    a conductive top lead layer coupled to the second terminal, the conductive top lead layer being disposed to cover the second fixed layer, wherein the second fixed layer covers a second portion of the second barrier layer; and
    a spacer configured to insulate the first conductive plug from the conductive top lead layer and the second fixed layer, wherein the spacer covers a center portion of the second barrier layer.

2. The memory cell of claim 1, wherein a read electrical path enables an electrical signal to flow through the second MTJ structure to perform a read operation, wherein the read electrical path is configured to include:
    the first terminal;
    the second barrier layer;
    the free layer;
    the second fixed layer;
    the conductive top lead layer; and
    the second terminal.

3. The memory cell of claim 2, wherein the read electrical path is configured to bypass the first barrier layer.

4. The memory cell of claim 2, wherein a direction of the read electrical path is configured to be in plane with the free layer.

5. The memory cell of claim 1, wherein the first MTJ structure further comprises a conductive bottom lead layer coupled to the third terminal, wherein the first fixed layer covers the conductive bottom lead layer.

6. The memory cell of claim 5, wherein a write electrical path enables an electrical signal to flow through the first MTJ structure to perform a write operation, wherein the write electrical path is configured to include:
    the first terminal;
    the second barrier layer;
    the free layer;
    the first barrier layer;
    the first fixed layer;
    the conductive bottom lead layer; and
    the third terminal.

7. The memory cell of claim 6, wherein a direction of the write electrical path is configured to be perpendicular to the free layer.

8. The memory cell of claim 6, wherein the write electrical path is configured to bypass the second terminal and the second fixed layer.

9. The memory cell of claim 6, wherein a voltage applied between the first terminal and the third terminal controls the magnetization direction to perform the write operation of the data, wherein a value of the data stored in the free layer is determined by the magnetization direction.

10. The memory cell of claim 6, wherein time to perform the write operation is at most equal to about 1 nanoseconds.

11. The memory cell of claim 1, wherein a Tantalum (Ta) based seed layer is inserted between the first fixed layer and first barrier layer to increase crystallization of the first barrier layer.

12. The memory cell of claim 11, wherein the Tantalum (Ta) based seed layer provides a self-biased static field in the first fixed layer to trigger spin precession in the free layer.

13. The memory cell of claim 1, wherein the magnetization direction is controlled by switching the electric field, wherein the switching causes a change in the magnetization direction from being perpendicular to plane direction of the free layer to being in plane with the free layer in dependence of the electric field.

14. The memory cell of claim 13, wherein the switching changes a perpendicular magnetic anisotropy (PMA) property of the free layer to cause a voltage induced precessional dynamic switching of the magnetization direction.

15. The memory cell of claim 1, wherein a ratio of a thickness of the first barrier layer to a thickness of the second barrier layer is between 2:1 and 5:1.

16. The memory cell of claim 1, wherein the first barrier layer is configured to include a Magnesium Oxide (MgO) based dielectric material, wherein the second barrier layer is configured to include another oxide based dielectric material that is different than the MgO based dielectric material.

17. A method for operating a memory cell, the method comprising:
    providing the memory cell, wherein the memory cell includes
        at least three terminals including first, second, and third terminals,
        a first magnetic tunnel junction (MTJ) structure coupled between the first terminal and the third terminal, wherein a portion of the first MTJ structure is configured to include a first barrier layer disposed between a first fixed layer and a free layer, and
        a second MTJ structure coupled between the first terminal and the second terminal, wherein a portion of the second MTJ structure is configured to include a second barrier layer disposed between a second fixed layer and the free layer;
    receiving a request to write data;
    applying an electric field across the first terminal and the third terminal to control magnetization direction of the free layer; and
    writing the data to the free layer, wherein the magnetization direction of the free layer is used to store the data, and wherein a tunnel magnetoresistance (TMR) of the second barrier layer is used to read the data.

18. A method for fabricating a memory cell, the method comprising:
    forming a magnetic tunnel junction (MTJ) stack, the MTJ stack including a conductive bottom lead layer coupled to a third terminal,
a first fixed layer formed to cover the conductive bottom lead layer,
a first barrier layer formed to cover the first fixed layer,
a free layer formed to cover the first barrier layer,
a second barrier layer formed to cover the free layer,
a second fixed layer formed to cover the second barrier layer, and
a conductive top lead layer formed to cover the second fixed layer;

etching end portions of the MTJ stack to form a first intermediate MTJ structure;

forming a first protective layer to protect the first intermediate MTJ structure;

backfilling the end portions of the first intermediate MTJ structure;

planarizing the first MTJ stack to form a second intermediate MTJ structure;

etching a side portion of the second intermediate MTJ structure to form a third intermediate MTJ structure, wherein the etching exposes a portion of the second barrier layer;

forming a second protective layer to protect the exposed portion of the third intermediate MTJ structure;

backfilling the exposed portion of the third intermediate MTJ structure to form a fourth intermediate MTJ structure;

etching a first portion of the fourth intermediate MTJ structure to expose a portion of the second barrier layer and etching a second portion of the fourth intermediate MTJ structure to expose a portion of the conductive top lead layer to form a fifth intermediate MTJ structure; and filling the first portion and the second portion of the fifth intermediate MTJ structure with conductive material to form the first terminal and the second terminal respectively.

* * * * *